United States Patent [19]

Schober

[11] Patent Number: 4,680,251
[45] Date of Patent: Jul. 14, 1987

[54] PROCESS FOR THE OZONE PROTECTION OF PHOTOPOLYMER FLEXOGRAPHIC PRINTING PLATES BY TREATMENT WITH LIQUID POLYETHERS

[75] Inventor: Manfred Schober, Offenbach, Fed. Rep. of Germany

[73] Assignee: E. I. Du Pont de Nemours and Company, Wilmington, Del.

[21] Appl. No.: 724,771

[22] Filed: Apr. 18, 1985

[30] Foreign Application Priority Data

Apr. 21, 1984 [DE] Fed. Rep. of Germany ....... 3415045

[51] Int. Cl.$^4$ .......................... G03F 7/10; G03F 7/02
[52] U.S. Cl. .................................. 430/306; 430/309; 430/331; 430/912; 430/918; 101/395
[58] Field of Search ............... 430/306, 309, 331, 912, 430/918; 101/395

[56] References Cited

U.S. PATENT DOCUMENTS 3,745,028  7/1973  Ranner ................................ 430/331
4,323,637  4/1982  Chen et al. .......................... 430/271

OTHER PUBLICATIONS

Dow Chemical Europe: "A Selector Guide to Properties of Polyglycols", pp. 934–937.

Primary Examiner—Richard L. Schilling

[57] ABSTRACT

The invention relates to a process for the ozone protection of an imagewise exposed and developed photopolymer flexographic printing plate, having an elastomeric, thermoplastic polymeric binder, which comprises applying to the exposed and developed surface of the flexographic printing plate at least one known liquid polyether of the formulas:

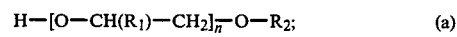

(a)

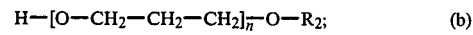

(b)

a block copolymer of the formula  (c)

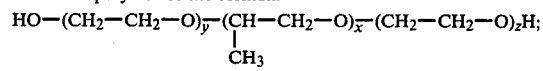

a random copolymer of the formula  (d)

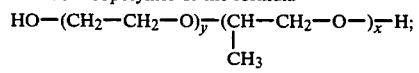

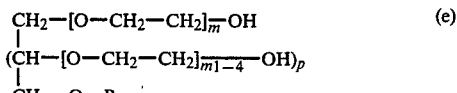

(e)

wherein
$R_1 =$ H, or methyl
$R_2 =$ H, alkyl or alkylene with $C_{12}$–$C_{18}$, and saturated and unsaturated fatty acid radicals with $C_{12}$–$C_{18}$.
$p = 1$–$4$ and wherein n, m and $m_{1-4}$ and x, y, and z are so selected that the molecular weight ($\overline{M}_n$) of the molecule is about 500 to 5000.

9 Claims, No Drawings

PROCESS FOR THE OZONE PROTECTION OF PHOTOPOLYMER FLEXOGRAPHIC PRINTING PLATES BY TREATMENT WITH LIQUID POLYETHERS

FIELD OF THE INVENTION

The invention relates to a process for the ozone protection of photopolymer flexographic printing plates by application of liquid polyethers.

BACKGROUND OF THE INVENTION

On account of their easier production, photopolymer flexographic printing plates, as described, for example, in U.S. Pat. No. 4,323,637, German Pat. Nos. 2,138,582, and 2,223,808 as well as U.S. Pat. No. 4,197,130, have been used extensively in flexographic printing. Such plates are exposed using high intensity UV-light. The ozone formed thereby can react with the elastomeric binder constituents of the plates, as, for example, polystyrene-polyisoprene-polystyrene and polystyrene-polybutadiene-polystyrene block copolymers, as described in U.S. Pat. No. 4,323,637, causing embrittlement and cracking. The aforementioned patents are incorporated by reference.

In order to counteract this undesirable effect ozone protective agents may be incorporated in the photosensitive composition. For example, the following antiozonants are described in U.S. Pat. No. 4,323,637; microcrystalline wax and paraffin wax, dibutyl thiourea, 1,1,3,3-tetramethyl-2-thiourea, norbornene, e.g., di-5-norbornene-2-methyl adipate, di-5-norbornene-2-methyl maleate, di-5-norbornene-2-methyl terephthalate, N-phenyl-2-naphthylamine, unsaturated vegetable oils, e.g., rapeseed oil, linseed oil, and safflower oil, polymers and resins, e.g., ethylene-vinyl acetate copolymers, chlorinated polyethylene, chlorosulfonated polyethylene, chlorinated ethylene-methacrylic acid copolymer, polyurethanes, polypentadienes, polybutadienes, resins derived from furfurol, ethylene-propylene-diene rubber, diethylene glycol esters of resins and copolymers of α-methyl styrene with vinyl toluene.

In actual practice, however, these additives often provide insufficient resistance against undesirable embrittlement and crack formation, especially with high ozone concentrations. Moreover, this problem cannot be eliminated by incorporating large quantities of antiozonants alone because this adversely affects the sensitometric and mechanical properties of the photopolymer materials.

Especially high ozone concentrations are found when flexible packaging materials, such as paper, cardboard or plastic films such as polyethylene and polypropylene films are printed on. In order to obtain sufficient adhesion of the printing ink to the polyethylene or polypropylene film, these films are pretreated before printing with electrical spark discharge, which produces considerable quantities of ozone. Because this pretreatment is most effective when applied immediately before the printing process, it is unavoidable that the flexographic printing plates are exposed to the ozone thus generated. The elastomeric parts of the flexographic printing plate react with the ozone by becoming brittle. This can lead to cracking, especially under the strong mechanical stress exerted on flexographic printing plates in a mounted state.

Underlying this invention is the need to increase the ozone resistance of photopolymer flexographic printing plates already mounted on printing cylinders, thereby improving the long-term storage stability of such mounted plates even in the presence of high ozone levels, as found in film printing operations.

BRIEF SUMMARY OF THE INVENTION

In accordance with this invention there is provided a process for the ozone protection of an imagewise exposed and developed photopolymer flexographic printing plate having an elastomeric, thermoplastic polymeric binder which comprises applying to the exposed and developed surface of the flexographic printing plate at least one known liquid polyether of the formulas:

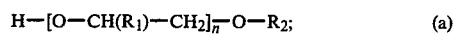  (a)

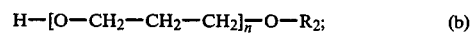  (b)

a block copolymer of the formula  (c)

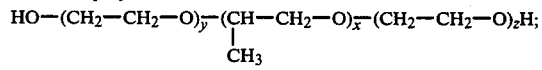

a random copolymer of the formula  (d)

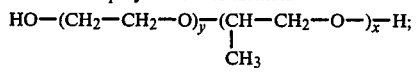

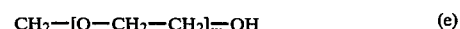  (e)

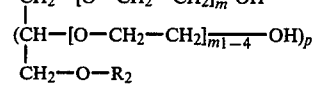

wherein
$R_1$ = H, or methyl
$R_2$ = H, alkyl or alkylene with $C_{12}$–$C_{18}$, and saturated and unsaturated fatty acid radicals with $C_{12}$–$C_{18}$.
p = 1–4
and wherein n, m and $m_{1-4}$ and x, y, and z are so selected that the molecular weight ($\overline{M}_n$) of the molecule is about 500 to 5000.

DETAILED DESCRIPTION OF THE INVENTION

As noted above this invention relates to the treatment of photopolymer flexographic printing plates subsequent to imagewise exposure and liquid development which removes the unpolymerized areas. Useful photopolymer flexographic materials are those which contain an elastomeric binder, e.g., unsaturated elastomer, as well as ethylenically unsaturated compounds and photoinitiators as is known to those skilled in the art. Preferred binders are block copolymer binders as described in U.S. Pat. Nos. 4,197,130, 4,323,637, and 4,430,417, which are incorporated herein by reference. Examples of such elastomeric block copolymer binders include:
styrene/butadiene/styrene; styrene/isoprene/styrene; styrene/butadiene or isoprene/homopolymer or copolymer of at least one aliphatic diene hydrocarbon with 4 to 5 carbon atoms; as well as three-block copolymers wherein the two terminal blocks are random copolymer blocks of styrene and butadiene and/or isoprene and where the central block is a homopolymer of butadiene or isoprene.

Liquid polyethyene- and polypropylene glycol ethers with a number average molecular weight of about 500 to 5000, as well as liquid polyethylene glycol ethers with a number average molecular weight of 500 to 5000 partially etherified or esterified with fatty radicals, have proven especially advantageous. Polyalcohols having three to six carbons partially etherified or esterified with fatty radicals and polyethoxylated so that the molecular weight of the molecular is about 500 to 5000 are particularly useful. The polyethers listed in Table 3 have been demonstrated to be suitable antiozonants.

Useful polyethers that fall within formulas (a) to (e) above include the following:

(a) polypropylene-1,2-glycol with a number average molecular weight of about 500 to 5000;
   a semi-etherified polyethylene glycol with a number average molecular weight of about 500 to 5000 and a fatty alkyl or alkylene radical of $C_{12}$ to $C_{18}$;
   a semi-esterified polyethylene glycol with a number average molecular weight of about 500 to 5000 and a saturated or unsaturated fatty acid radical of $C_{12}$ to $C_{18}$;

(b) polypropylene-1,3-glycol with a number average molecular weight of about 500 to 5000;

(c) a block copolymer of ethylene glycol and propylene glycol with a number average molecular weight of about 500 to 5000;

(d) a random copolymer of ethylene glycol and propylene glycol with a number average molecular weight of about 500 to 5000;

(e) polyethylene glycol glyceryl monooleate with a total of 10 to 70 ethylene oxide groups; polyethylene glycol sorbitol monolaurate with a total of 10 to 70 ethylene oxide groups.

The amount of polyether to be applied is preferably 1 to 10 mg/cm$^2$ of flexographic printing plate, and preferably the entire plate rather than only the printing parts is treated.

The application of the liquid polyether onto the flexographic printing plates can be carried out manually, by using a cotton swab, sponge or brush, or by dipping the printing plate into a bath. The polyether can also be applied mechanically, as for example, by spraying or rinsing.

Flexographic printing plates treated in this manner exhibit very good aging behavior. They retain their original flexibility even during relatively long storage times on the printing cylinder before and after the printing process and do not have a tendency to form cracks. This result is surprising and unexpected, because neither the subsequent application of ozone protective agents, such as polyurethane or paraffin known from U.S. Pat. No. 4,323,637, nor the subsequent application of chemically related compounds, such as low molecular weight polyethers, e.g., number average molecular weight less than 500, provides sufficient ozone protection. In fact, treatment with ethylene glycol and triethylene glycol actually increases susceptibility to ozone-caused formation of cracks.

These facts are explained in greater detail in the following examples wherein the parts and percentages are by weight. Polymeric molecular weights are expressed as number average molecular weights ($\overline{M}_n$). The $\overline{M}_n$ for the polymers described herein can be determined by gel permeation chromatography employing a known standard, e.g., butadiene or another standard known to those skilled in the art.

EXAMPLE 1

A flexographic printing plate containing ozone protective agents is produced according to the data of Example 36 of U.S. Pat. No. 4,323,637. The imagewise exposed and developed flexographic printing plate is made nontacky by immersion in a 0.4% aqueous chlorine or bromine solution, is rinsed with water and is dried. Subsequently four samples 3 cm×7 cm, with a thickness of 2.8 mm are produced from this printing plate and are mounted using a molding strip onto a printing cylinder with a 5 cm diameter.

While Sample 1 remains untreated, Sample 2 is treated with ethylene glycol using a cotton swab, Sample 3 is treated with triethylene glycol and Sample 4 with polyethylene glycol, molecular weight 600.

The printing cylinder on which the samples are mounted is then placed in an ozone chamber with 12 ppm ozone to attain an accelerated formation of cracks. While under actual conditions in a printing operation with ozone levels of about 0.1 ppm, the untreated flexographic printing plates exhibit crack formation in approximately 2–3 months, in the ozone chamber a comparable state is reached in about 5 minutes.

The following results are obtained:

TABLE 1

| Sample | Treatment | Time until the start of the formation of cracks in minutes |
|---|---|---|
| 1. | None | 5 |
| 2. | Ethylene glycol | 2 |
| 3. | Triethylene glycol | 4 |
| 4. | Polyethylene glycol, molecular weight 600 | 20 |

This example shows that the application of ethylene glycol and triethylene glycol not only cannot retard crack formation, but can actually accelerate it, whereas using polyethylene glycol 600 achieves a 20 minute stability in the ozone chamber.

EXAMPLE 2

Example 1 is repeated using 1,3-propanediol, and polypropylene-1,3-glycols 1200, 2000 and 4000*. The results summarized in Table 2 are achieved:

TABLE 2

| Treatment | Time until the start of the formation of cracks in minutes |
|---|---|
| 1,3-Propanediol | 5 |
| Polypropylene-1,3-glycol 1200 | 20 |
| Polypropylene-1,3-glycol 2000 | 60 |
| Polypropylene-1,3-glycol 4000 | 70 |

*Polyglycol P1200, Polyglycol P2000, and Polyglycol P4000, products of Dow Chemical Company, Midland, MI, USA, having average molecular weights of 1200, 2000, and 4000, respectively.

These results show that with the liquid polypropylene-1,3-glycols an unexpected improvement of ozone resistance up to 70 minutes is seen with increasing molecular weight, whereas 1,3-propanediol is ineffective.

EXAMPLE 3

Example 1 is repeated, however the printing plate is divided into 6 parts. These are mounted onto a printing cylinder and are treated with the substances listed in Table 3.

TABLE 3

| Polyether 1 | polyethylene glycol monooleyl ether $H[OCH_2CH_2]_{10}O-(CH_2)_8-CH=CH-(CH_2)_7-CH_3$ |
|---|---|
| Polyether 2 | ethylene glycol/propylene-1,2-glycol block copolymer |

TABLE 3-continued $$HO(CH_2CH_2O)_y-(CHCH_2O)_x-(CH_2CH_2O)_yH$$
$$\underset{CH_3}{|} \quad y=4$$
$$x=50$$

Average molecular weight 3650 with about
20% polyethylene oxide

Polyether 3  ethoxylated glycerin monooleate $$CH_2-(OCH_2CH_2)_m-OH \qquad m+m_1=20$$
$$|$$
$$CH-(OCH_2CH_2)_{m1}-OH$$
$$|$$
$$CH_2-O-CO-(CH_2)_7CH=CH-(CH_2)_7CH_3$$

Polyether 4  ethoxylated sorbitol monolaurate $$CH_2O(CH_2CH_2O)_mH \qquad m+m_{1-4}=20$$
$$|$$
$$CHO(CH_2CH_2O)_{m1}H$$
$$|$$
$$CHO(CH_2CH_2O)_{m2}H$$
$$|$$
$$CHO(CH_2CH_2O)_{m3}H$$
$$|$$
$$CHO(CH_2CH_2O)_{m4}H$$
$$|$$
$$CH_2-O-CO-(CH_2)_{10}CH_3$$

The results listed in Table 4 are obtained in the ozone chamber:

TABLE 4

| Treatment | Time until the start of the formation of cracks in minutes |
|---|---|
| Glycerin (control) | 5 |
| Liquid paraffin wax (control) | 5 |
| Polyether 1 of Table 3 | 35 |
| Polyether 2 of Table 3 | 45 |
| Polyether 3 of Table 3 | 120 |
| Polyether 4 of Table 3 | 120 |

There is no loss of the applied substances by evaporation during treatment in the ozone chamber.

These results show that glycerin or paraffin wax, in spite of good wetting of the printing plate, are completely ineffective, while the polyethers 1-4 of the invention exhibit a good stabilizing action against ozone.

I claim:

1. A process for the ozone protection of an imagewise exposed and developed photopolymer flexographic printing plate, having an elastomeric, thermoplastic polymeric binder, which comprises applying to the exposed and developed surface of the flexographic printing plate at least one known liquid polyether of the formulas:

$$H-[O-CH(R_1)-CH_2]_n-O-R_2; \qquad (a)$$

-continued $$H-[O-CH_2-CH_2-CH_2]_n-O-R_2; \qquad (b)$$

a block copolymer of the formula (c)

$$HO-(CH_2-CH_2-O)_y-(CH-CH_2-O)_x-(CH_2-CH_2-O)_zH;$$
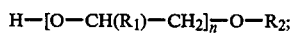
$$CH_3$$

a random copolymer of the formula (d)

$$HO-(CH_2-CH_2-O)_y-(CH-CH_2-O-)_x-H;$$
$$|$$
$$CH_3$$

$$CH_2-[O-CH_2-CH_2]_m-OH \qquad (e)$$
$$|$$
$$(CH-[O-CH_2-CH_2]_{m1-4}-OH)_p$$
$$|$$
$$CH_2-O-R_2$$

wherein
$R_1=H$, or methyl
$R_2=H$, alkyl or alkylene with $C_{12}-C_{18}$, and saturated and unsaturated fatty acid radicals with $C_{12}-C_{18}$.
$p=1-4$
and wherein n, m and $m_{1-4}$ and x, y, and z are so selected that the molecular weight ($\overline{M}_n$) of the molecule is about 500 to 5000.

2. Process according to claim 1, wherein the polyether is polypropylene-1,2-glycol with a number average molecular weight of about 500 to 5000.

3. Process according to claim 1, wherein the polyether is polypropylene-1,3-glycol with a number average molecular weight of about 500 to 5000.

4. Process according to claim 1, wherein the polyether is a block copolymer comprising ethylene glycol and propylene glycol with a number average molecular weight of about 500 to 5000.

5. Process according to claim 1, wherein the polyether is a semi-etherified polyethylene glycol with a number average molecular weight of about 500 to 5000 and an alkyl or alkylene radical of $C_{12}$ to $C_{18}$.

6. Process according to claim 1, wherein the polyether is a semi-esterified polyethylene glycol with a number average molecular weight of about 500 to 5000 and a saturated or unsaturated fatty acid radical of $C_{12}$ to $C_{18}$.

7. Process according to claim 1, wherein the polyether is polyethylene glycol glyceryl monooleate with a total of 10 to 70 ethylene oxide groups.

8. Process according to claim 1, wherein the polyether is polyethylene glycol sorbitol monolaurate with a total of 10 to 70 ethylene oxide groups.

9. Process according to claim 1, wherein 1 to 10 mg/cm² of the polyether is applied onto the surface of the printing plate.

* * * * *